(12) United States Patent
Li

(10) Patent No.: US 8,497,159 B2
(45) Date of Patent: Jul. 30, 2013

(54) METHOD OF MANUFACTURING LEADLESS INTEGRATED CIRCUIT PACKAGES HAVING ELECTRICALLY ROUTED CONTACTS

(75) Inventor: Tung Lok Li, Hong Kong (CN)

(73) Assignee: Kaixin, Inc., Hong Kong (CN)

(*) Notice: Subject to any disclaimer, the term of this patent is extended or adjusted under 35 U.S.C. 154(b) by 0 days.

(21) Appl. No.: 13/287,502

(22) Filed: Nov. 2, 2011

(65) Prior Publication Data
US 2012/0045870 A1 Feb. 23, 2012

Related U.S. Application Data

(63) Continuation of application No. 12/479,495, filed on Jun. 5, 2009, now Pat. No. 8,072,053, which is a continuation of application No. PCT/CN2009/072030, filed on May 27, 2009.

(60) Provisional application No. 61/158,170, filed on Mar. 6, 2009, provisional application No. 61/166,547, filed on Apr. 3, 2009.

(51) Int. Cl.
*H01L 21/48* (2006.01)
*H01L 23/31* (2006.01)
*H01L 23/495* (2006.01)

(52) U.S. Cl.
USPC ........... 438/113; 438/123; 257/676; 257/684; 257/708

(58) Field of Classification Search
USPC .................. 438/106, 113, 123, 132
See application file for complete search history.

(56) References Cited

U.S. PATENT DOCUMENTS

| 5,468,994 A | 11/1995 | Pendse |
| 5,661,337 A | 8/1997 | Manteghi |
| 6,084,292 A | 7/2000 | Shinohara |
| 6,191,494 B1 | 2/2001 | Ooyama et al. |
| 6,229,200 B1 | 5/2001 | Mclellan et al. |
| 6,238,952 B1 | 5/2001 | Lin |
| 6,242,281 B1 | 6/2001 | Mclellan et al. |

(Continued)

FOREIGN PATENT DOCUMENTS

| CN | 1222252 | 7/1999 |
| CN | 100385641 | 2/2006 |

(Continued)

OTHER PUBLICATIONS

U.S. Appl. No. 12/816,974, Tung Lok Li.

(Continued)

*Primary Examiner* — Olik Chaudhuri
*Assistant Examiner* — Wilner Jean Baptiste
(74) *Attorney, Agent, or Firm* — Winstead PC

(57) ABSTRACT

A method of manufacturing a leadless integrated circuit (IC) package comprising an IC chip mounted on a metal leadframe and a plurality of electrical contacts electrically coupled to the IC chip. The IC chip, the electrical contacts, and a portion of the metal leadframe are covered with an encapsulation compound, with portions of the electrical contacts exposed on a bottom surface of the encapsulation compound. The electrical contacts of the IC package having metal traces connecting bonding areas on a top surface thereof and contact areas on a bottom surface thereof, wherein at least some of the bonding areas are laterally disposed from the contact areas connected thereto.

9 Claims, 11 Drawing Sheets

U.S. PATENT DOCUMENTS

| | | | |
|---|---|---|---|
| 6,294,100 | B1 | 9/2001 | Fan et al. |
| 6,306,685 | B1 | 10/2001 | Liu et al. |
| 6,319,749 | B1 * | 11/2001 | Shigeta et al. ............... 438/106 |
| 6,372,539 | B1 | 4/2002 | Bayan et al. |
| 6,465,734 | B2 | 10/2002 | Yamada et al. |
| 6,498,099 | B1 | 12/2002 | McLellan et al. |
| 6,545,347 | B2 | 4/2003 | McClellan |
| 6,548,328 | B1 * | 4/2003 | Sakamoto et al. ............ 438/121 |
| 6,585,905 | B1 | 7/2003 | Fan et al. |
| 6,642,082 | B2 | 11/2003 | Yamaguchi et al. |
| 6,664,615 | B1 | 12/2003 | Bayan et al. |
| 6,670,222 | B1 | 12/2003 | Brodsky |
| 6,700,188 | B2 | 3/2004 | Lin |
| 6,777,265 | B2 | 8/2004 | Islam et al. |
| 6,812,552 | B2 | 11/2004 | Islam et al. |
| 6,940,154 | B2 | 9/2005 | Pedron et al. |
| 6,967,125 | B2 | 11/2005 | Fee et al. |
| 6,975,022 | B2 | 12/2005 | Sakamoto et al. |
| 6,995,458 | B1 | 2/2006 | Hashemi |
| 7,049,177 | B1 | 5/2006 | Fan et al. |
| 7,049,696 | B2 | 5/2006 | Kubo |
| 7,064,419 | B1 | 6/2006 | Bayan et al. |
| 7,129,116 | B2 | 10/2006 | Islam et al. |
| 7,173,321 | B2 | 2/2007 | Kim |
| 7,176,582 | B2 | 2/2007 | Kloen et al. |
| 7,186,588 | B1 | 3/2007 | Bayan et al. |
| 7,217,991 | B1 | 5/2007 | Davis |
| 7,247,526 | B1 | 7/2007 | Fan et al. |
| 7,270,867 | B1 | 9/2007 | Kwan et al. |
| 7,410,830 | B1 | 8/2008 | Fan et al. |
| 7,411,289 | B1 | 8/2008 | McLellan et al. |
| 7,419,855 | B1 | 9/2008 | Lee et al. |
| 7,541,668 | B2 | 6/2009 | Choi |
| 7,622,332 | B2 | 11/2009 | Islam et al. |
| 7,671,452 | B1 | 3/2010 | Bayan et al. |
| 7,749,809 | B2 | 7/2010 | How et al. |
| 7,786,557 | B2 | 8/2010 | Hsieh et al. |
| 7,880,282 | B2 | 2/2011 | Holland |
| 7,888,179 | B2 | 2/2011 | Kagaya et al. |
| 2003/0207498 | A1 | 11/2003 | Islam et al. |
| 2004/0251557 | A1 | 12/2004 | Kee |
| 2006/0267164 | A1 | 11/2006 | Chung et al. |
| 2007/0034993 | A1 | 2/2007 | Lange |
| 2007/0052076 | A1 | 3/2007 | Ramos et al. |
| 2007/0085199 | A1 | 4/2007 | Ong et al. |
| 2008/0258273 | A1 | 10/2008 | Liang et al. |
| 2008/0258278 | A1 | 10/2008 | Ramos et al. |
| 2008/0285251 | A1 | 11/2008 | Liang et al. |
| 2008/0290486 | A1 | 11/2008 | Chen et al. |
| 2008/0315412 | A1 | 12/2008 | Liang et al. |
| 2009/0194854 | A1 | 8/2009 | Tan et al. |
| 2010/0044884 | A1 | 2/2010 | Zbrzezny et al. |
| 2010/0224971 | A1 | 9/2010 | Li |

FOREIGN PATENT DOCUMENTS

| | | | |
|---|---|---|---|
| CN | 1929102 | | 3/2007 |
| EP | 0700086 | A2 | 3/1996 |
| JP | 2001024135 | A | 1/2001 |
| JP | 2005303039 | A | 10/2005 |
| JP | 2005317998 | A | 11/2005 |
| JP | 2006128734 | | 5/2006 |
| JP | 2007048981 | A | 2/2007 |
| WO | WO-03085731 | A1 | 10/2003 |

OTHER PUBLICATIONS

Xie, Shaojun, "International Search Report" for PCT/CN2009/072030, as mailed Dec. 10, 2009, 4 pages.

Zhi, Yue, "International Search Report", for PCT/CN2009/001320 as mailed Jun. 10, 2010 (4 pages).

Li, Qinghui, "International Search Report", for PCT/CN2010/000239 as mailed Jun. 3, 2010 (3 pages).

U.S. Appl. No. 13/262,709, Li.

U.S. Appl. No. 13/389,935, Li.

* cited by examiner

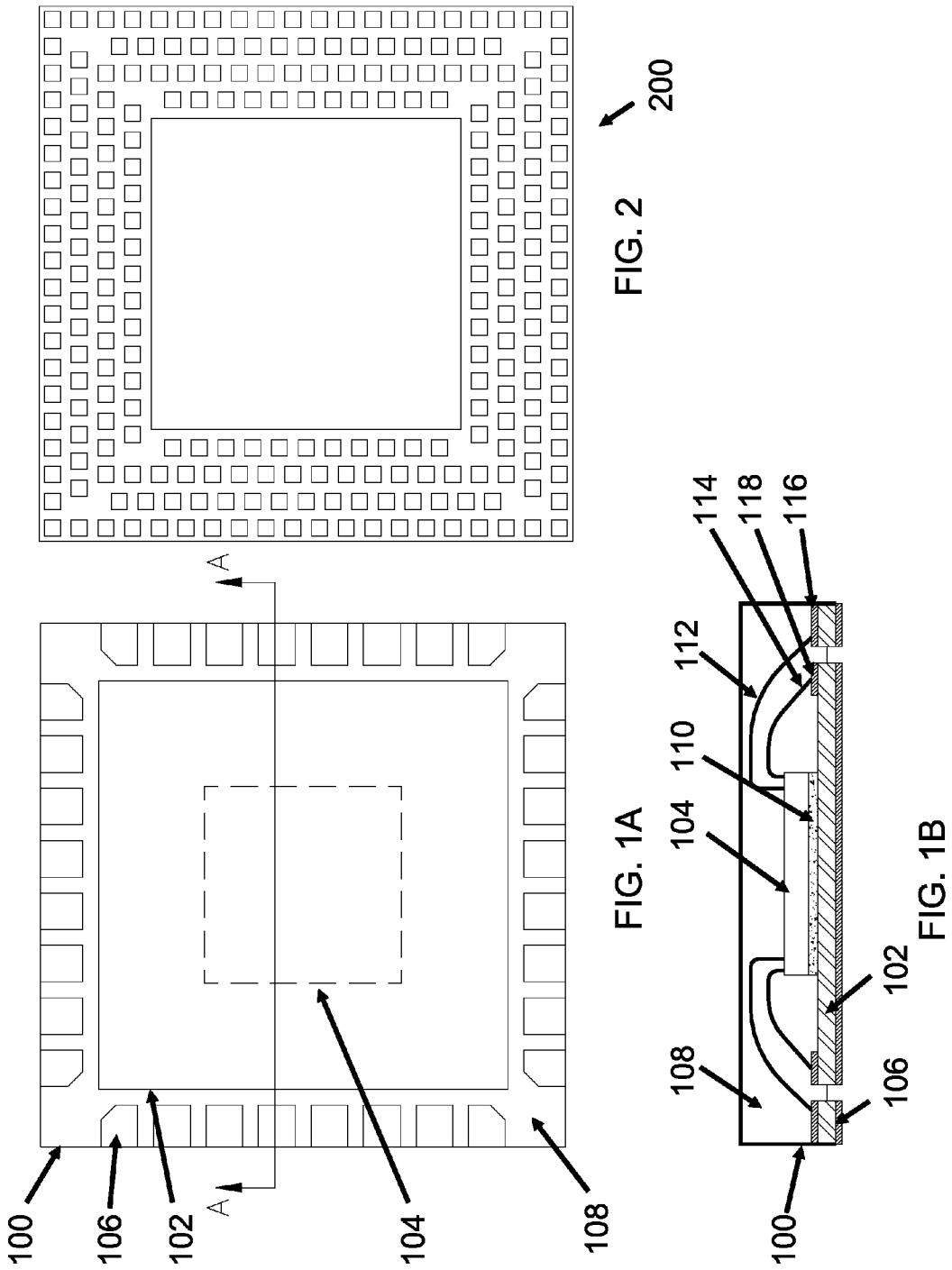

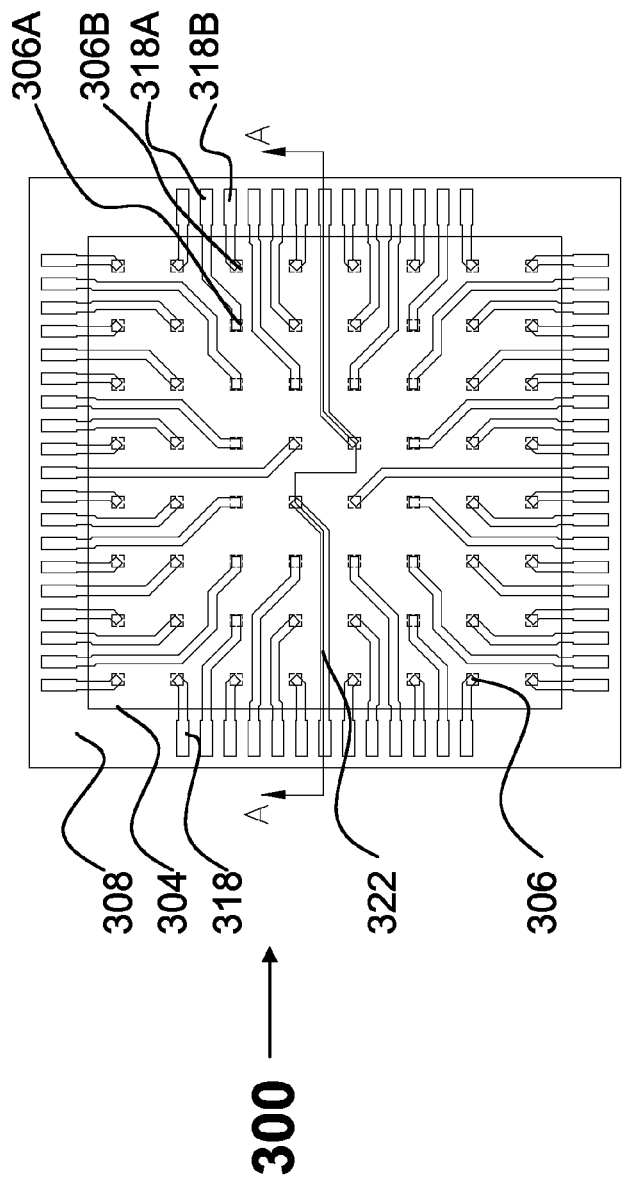
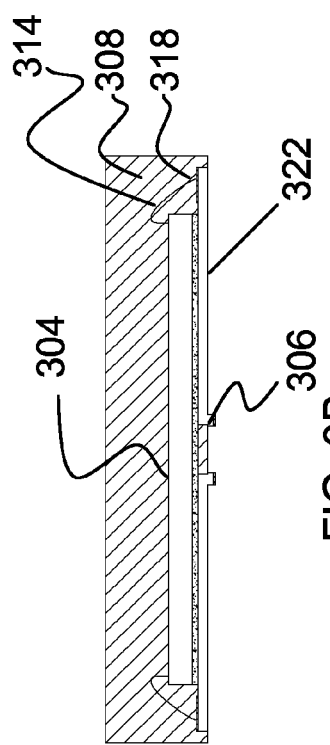
FIG. 3A
FIG. 3B

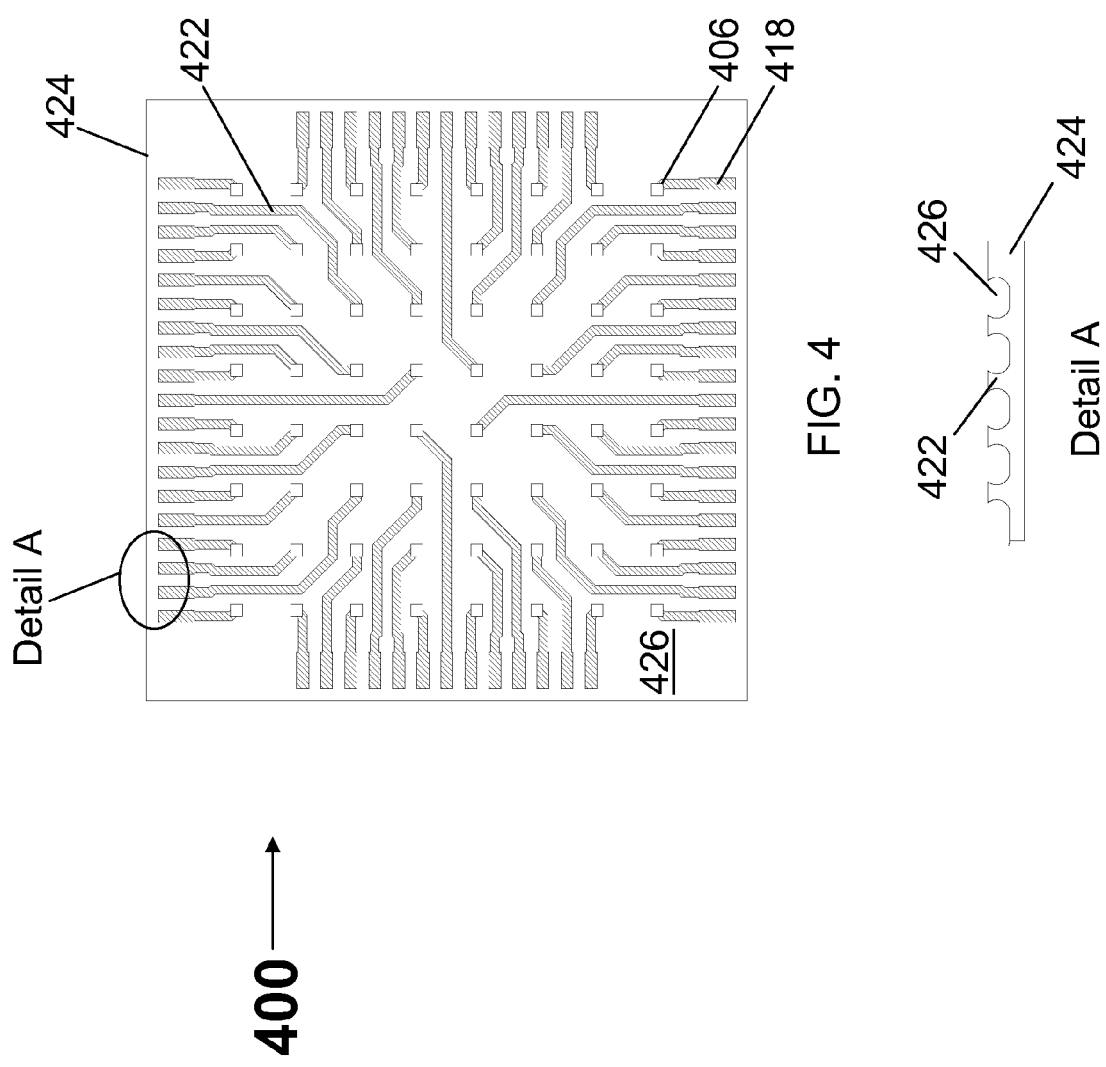

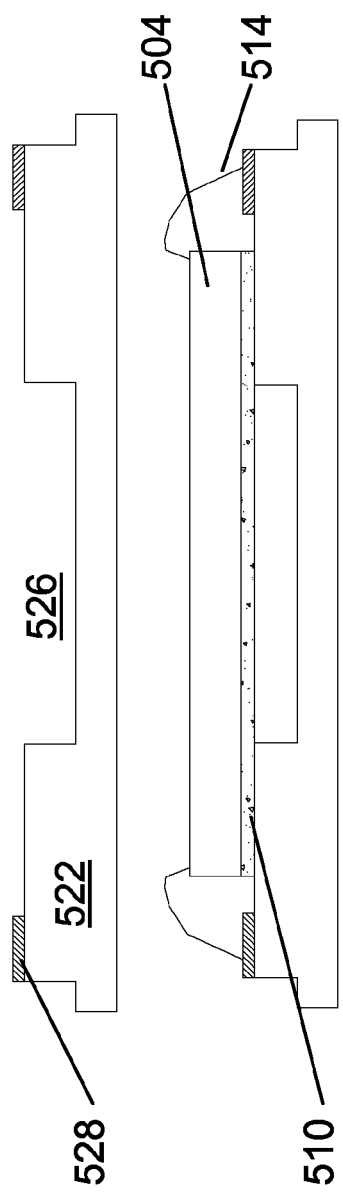
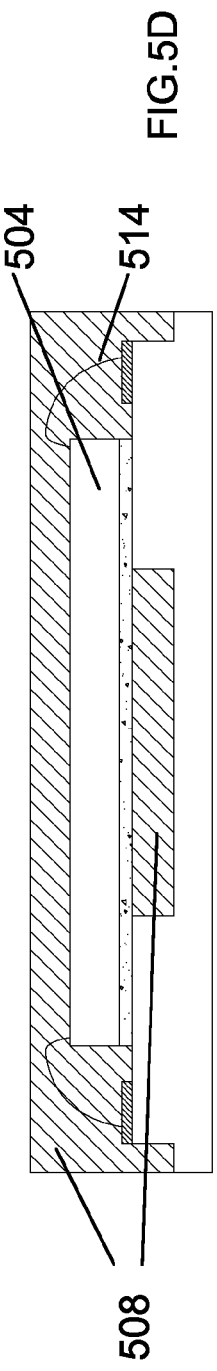
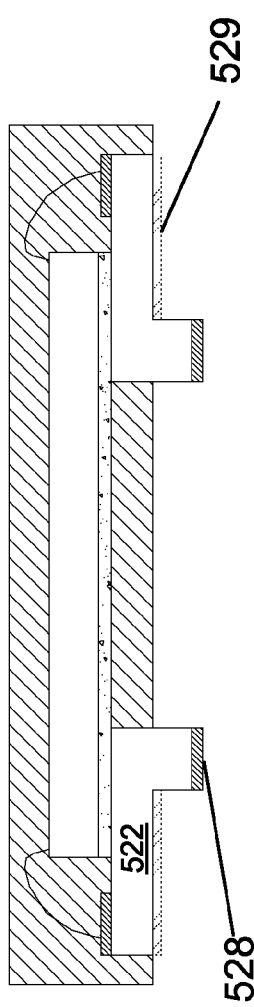
FIG. 5A
FIG. 5B
FIG. 5C
FIG. 5D
FIG. 5E

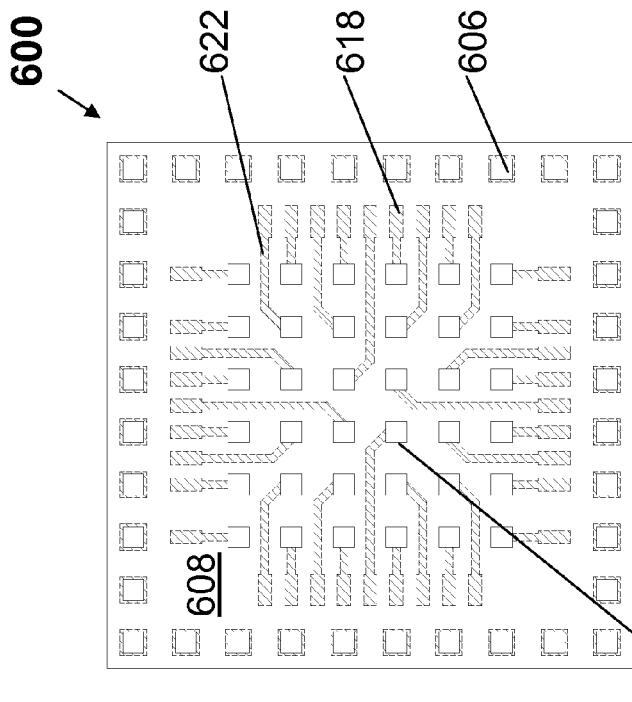
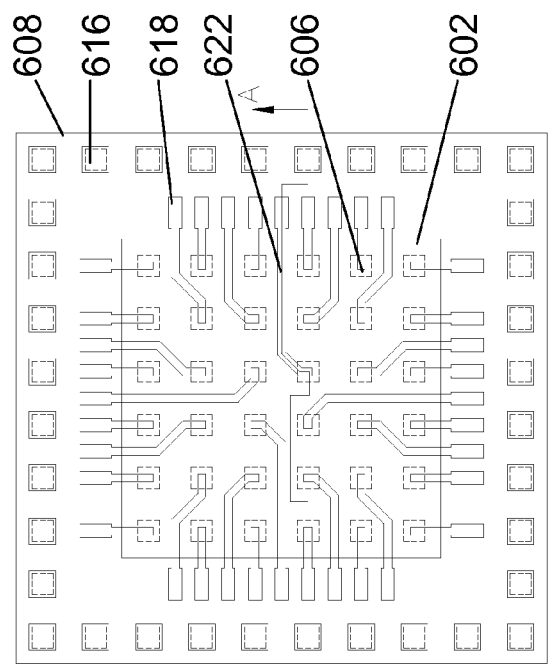
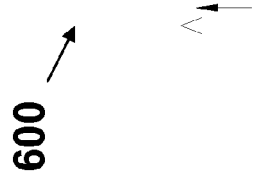
FIG.6A
FIG.6B
FIG.6C

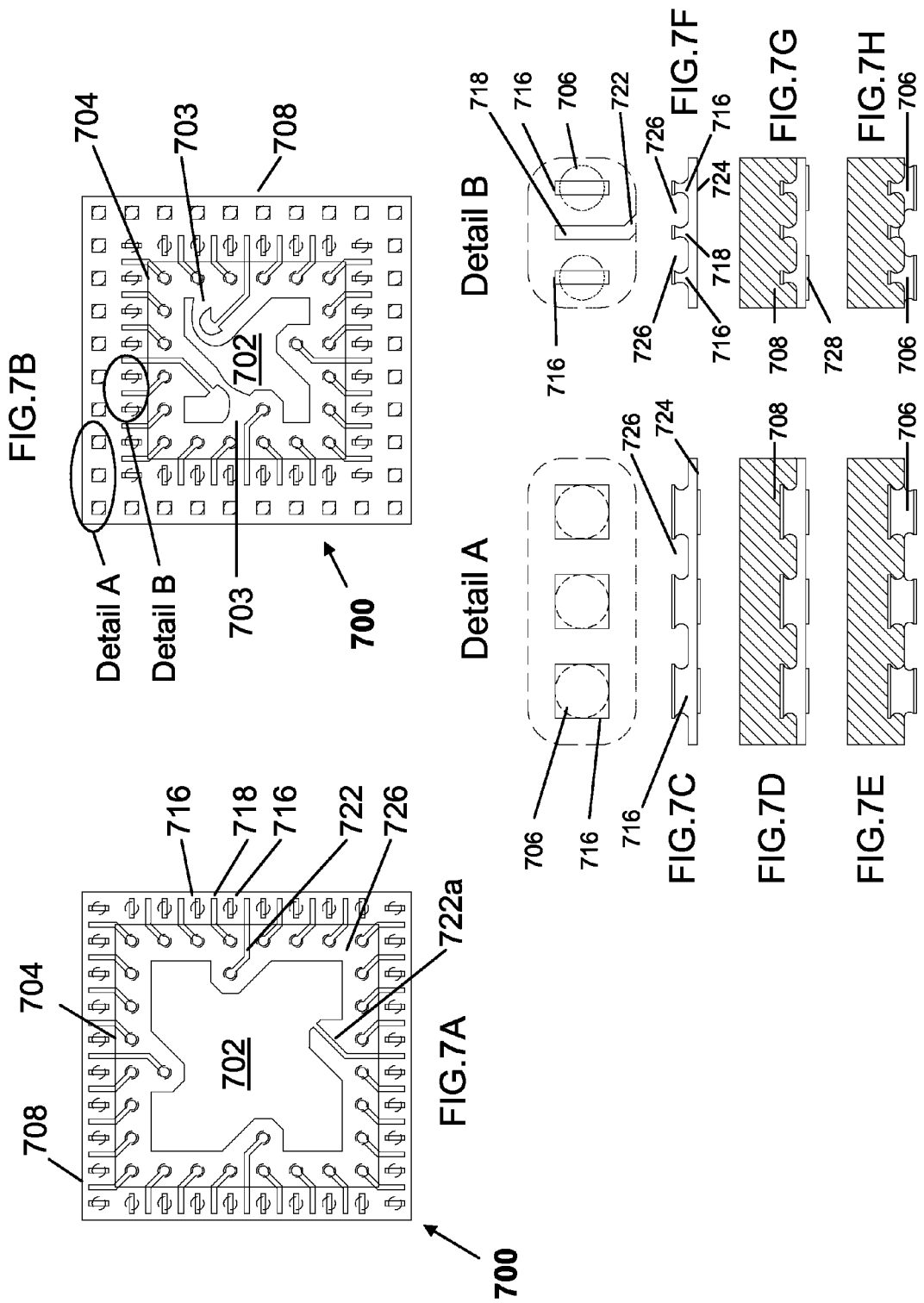

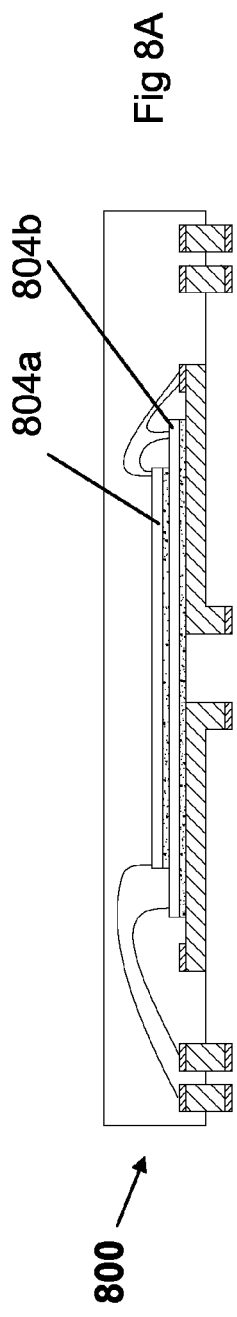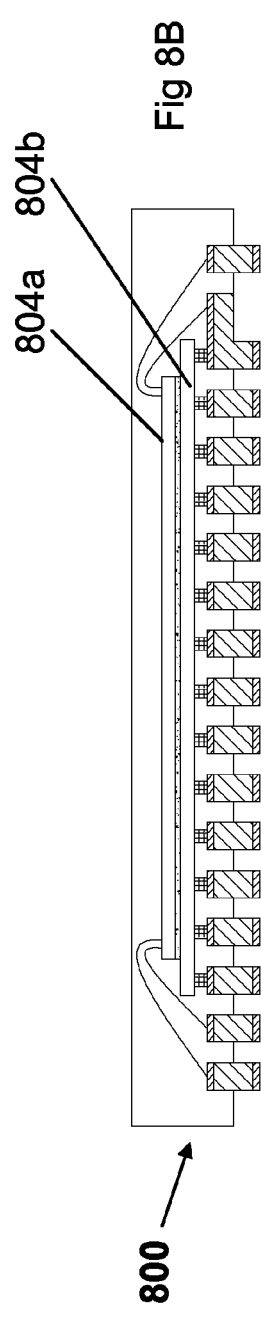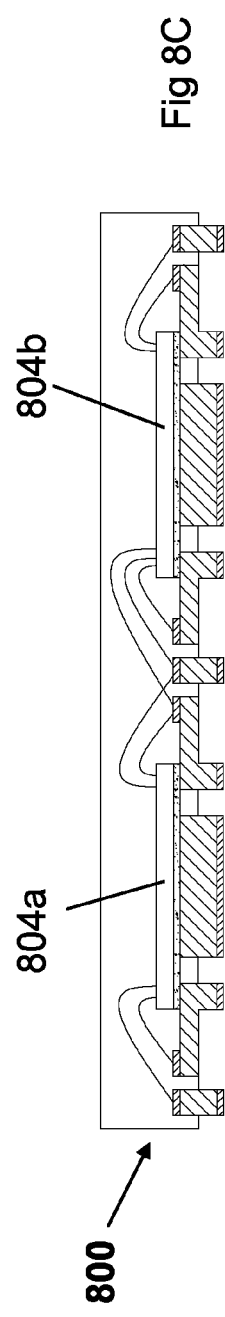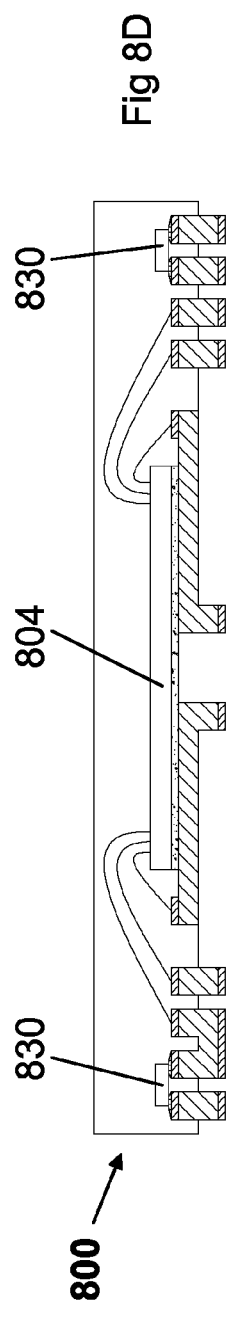

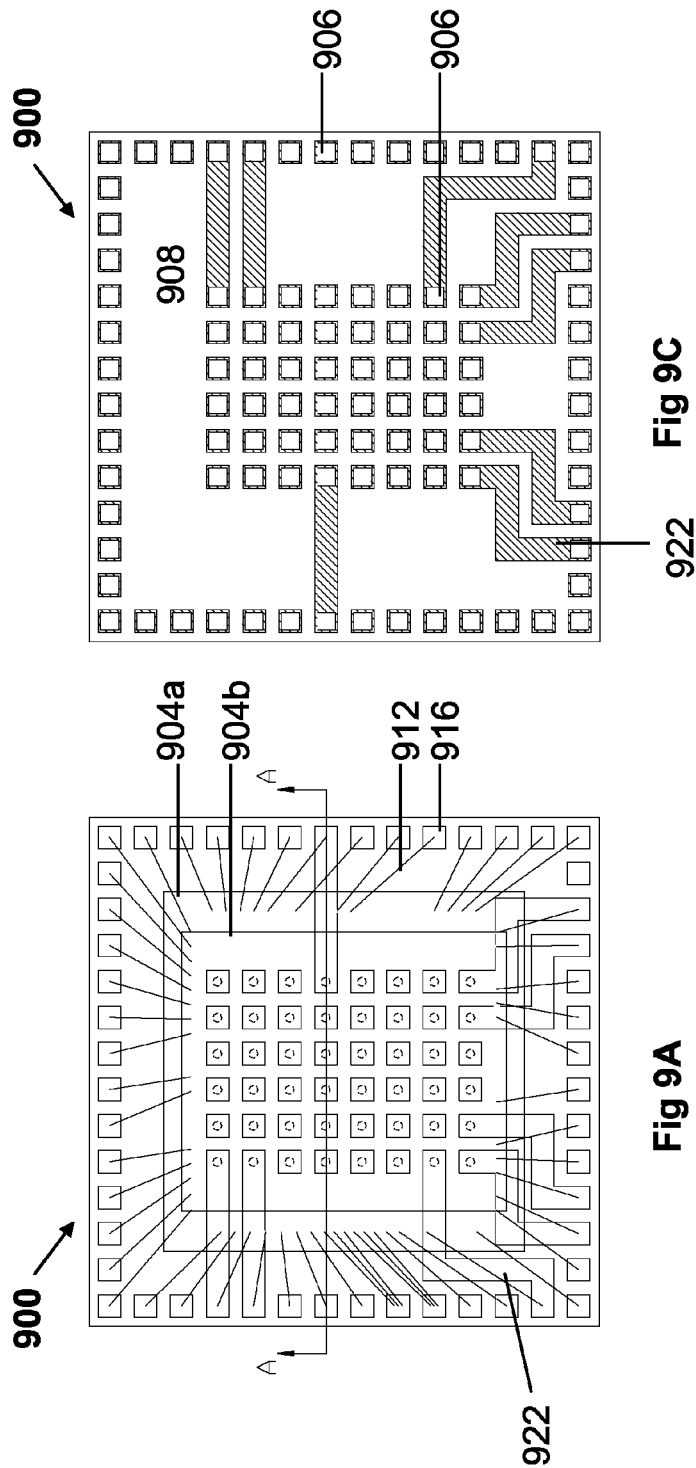

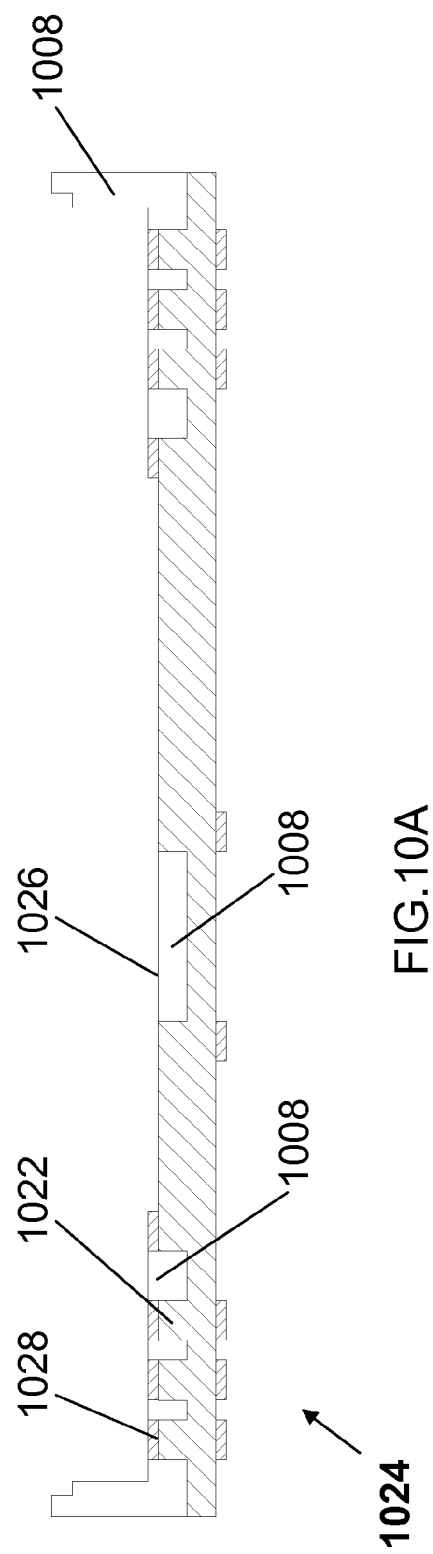
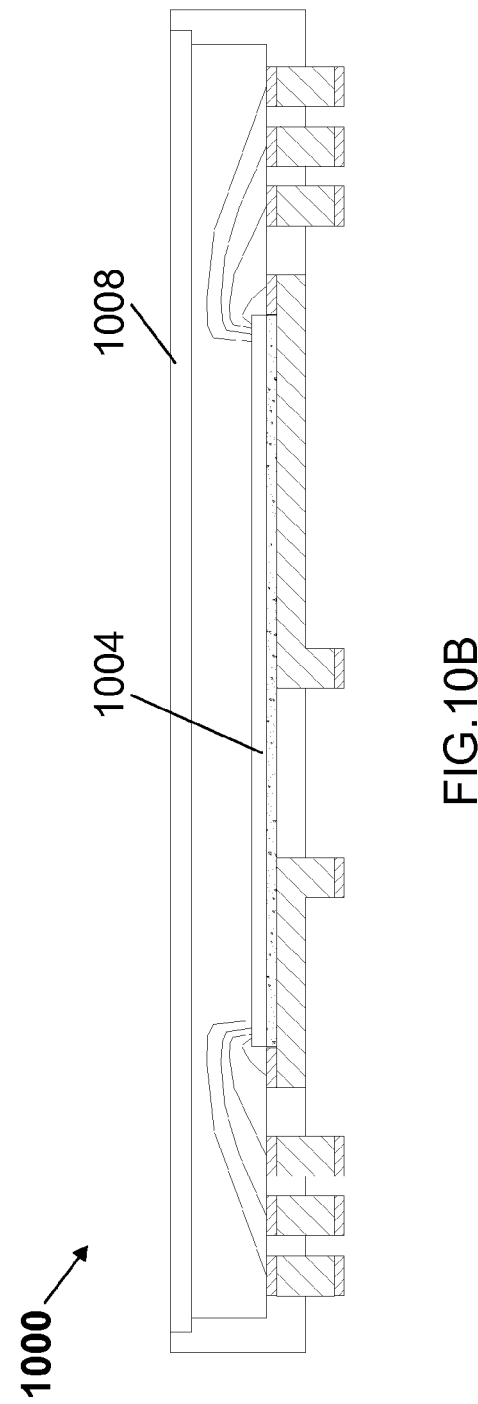
FIG.10A
FIG.10B

FIG.12A
| Package Type | Die Size | | |
|---|---|---|---|
| | 4x4 mm | 3x3 mm | 2x2 mm |
| QFN | N/A | 32 I/O, 1 Row | 44 I/O, 2 Row |
| TAPP | N/A | 36 I/O, 1 Row | 60 I/O, 2 Row |
| HLA | 64 I/O, 2 Row | 88 I/O, 4 Row | 100 I/O, 5 Row |
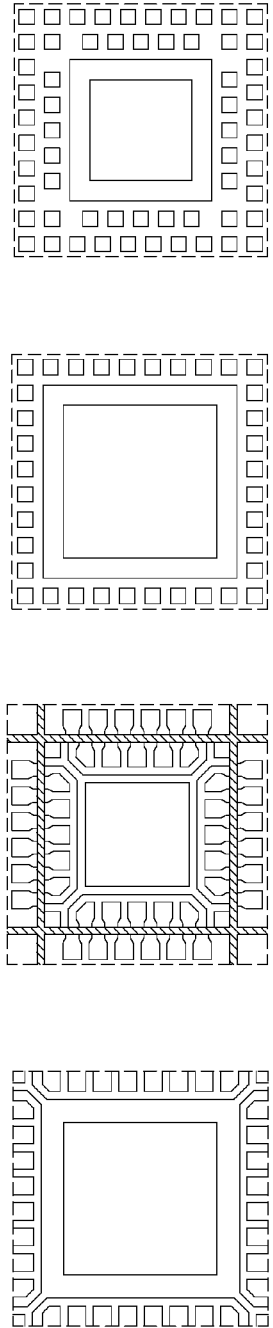
FIG.12B
FIG.12C
FIG.12D
FIG.12E
1201
1202
1203
1204
1205
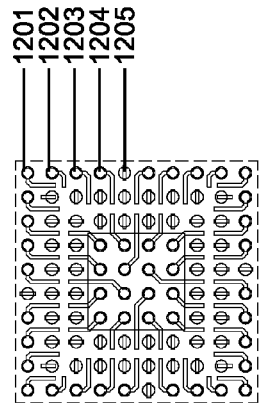
FIG.12H
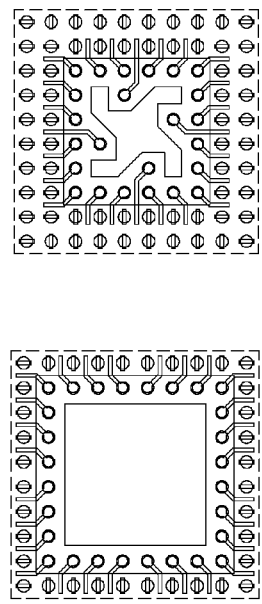
FIG.12F
FIG.12G

METHOD OF MANUFACTURING LEADLESS INTEGRATED CIRCUIT PACKAGES HAVING ELECTRICALLY ROUTED CONTACTS

CROSS-REFERENCE TO RELATED APPLICATIONS

This patent application is a continuation of U.S. patent application Ser. No. 12/479,495, filed 5 Jun. 2009 now U.S. Pat. No. 8,072,053, which claims priority to U.S. Provisional Patent Application Ser. Nos. 61/158,170, filed 6 Mar. 2009, and 61/166,547, filed 3 Apr. 2009, all of which are hereby incorporated by reference. U.S. patent application Ser. No. 12/479,495 is a continuation of PCT Application No. PCT/CN2009/072030, filed 27 May 2009, which claims priority to U.S. Provisional Patent Application Ser. Nos. 61/158,170, filed 6 Mar. 2009, and 61/166,547, filed 3 Apr. 2009, all of which are hereby incorporated by reference.

BACKGROUND

1. Technical Field

This patent application relates generally to integrated circuit (IC) packaging technology and, in particular, but not by way of limitation, to leadless IC packages having high density contacts and related methods of manufacture.

2. Background

IC packaging is one of the final stages involved in the fabrication of IC devices. During IC packaging, one or more IC chips are mounted on a package substrate, connected to electrical contacts, and then coated with an encapsulation material comprising an electrical insulator such as epoxy or silicone molding compound. The resulting structure, commonly known as an "IC package," may then be mounted onto a printed circuit board (PCB) and/or connected to other electrical components.

In most IC packages, the IC chip is completely covered by the encapsulation material, while the electrical contacts are at least partially exposed so that they can be connected to other electrical components. In other words, the electrical contacts are designed to form electrical connections between the IC chip inside the package and electrical components outside the IC package. Oftentimes, using a metal leadframe (LF) to form part of the IC package may be more cost effective than using a laminated board or tape material because, for example, more cost effective materials may be used, such as copper, nickel, or other metals or metal alloys, and use of such materials may allow more cost effective manufacturing processes to be employed, such as stamping or etching rather than multi-step laminate processes. One of the most common designs for these electrical contacts is one in which they form "leads" extending out from the sides of the encapsulating material. The leads typically are bent downward to form connections with electrical components on a PCB.

Oftentimes, the presence of external leads tends to significantly increase the size of IC packages. For instance, it may increase the length and width across the IC packages due to the horizontal extension of the leads. This increased size can be disadvantageous in systems where PCB space is limited. In addition, because the external leads are typically arranged along the sides of the IC packages, the pin count of the IC packages is limited by the linear distance around the IC packages. Another disadvantage is that these leads require an additional inspection step for straightness, co-planarity, and other required mechanical dimensions (and rework or scrap if they fail the specification). Finally, the leads (starting from the bonding fingers down to the tip of the external portions) add to the total electrical signal length (bond wires+leads), which may affect the electrical performance of the IC package.

Recognizing these and other problems with conventional IC packages, researchers have developed IC packages in which the external leads are replaced by electrical contacts that are covered on top by the encapsulating material but exposed on the bottom of the IC package so they can be connected to electrical components located beneath the IC package. These IC packages, referred to as "leadless" IC packages, tend to occupy less space compared with conventional IC packages due to the absence of the external leads. In addition, these IC packages eliminate the need to bend the leads to form connections. Some examples of conventional leadless IC packages are disclosed in U.S. Pat. Nos. 6,498,099 and 7,049,177, the respective disclosures of which are hereby incorporated by reference. Among other things, these patents describe and illustrate design variations for leadless IC packages and various techniques for manufacturing and using the leadless IC packages.

An example of a leadless IC package can be seen in FIGS. 1A and 1B. FIG. 1A is a bottom view of an IC package 100 having a die attach pad (DAP) 102 with an IC chip 104 mounted on a top surface thereof (shown as a dashed line in FIG. 1A). A plurality of contact points 106 can be seen disposed around an outside perimeter of the DAP 102. The contact points 106 may be utilized to provide contact points for electrically connecting the IC chip 104 and a PCB when the IC package 100 is mounted onto the PCB. An encapsulation compound 108 may be interposed between the DAP 102 and the plurality of contact points 106, for example, to isolate the contact points 106 from the DAP 102. FIG. 1B is a side view of a cross-section of the IC package 100 of FIG. 1A along line A-A. The IC chip 104 may be attached to the DAP 102 using a conductive epoxy 110. Wire bonds 112 may be utilized to form electrical connections from the IC chip 104 to a plurality of bonding points 116 on terminals which are electrically isolated from the DAP 102. Wire bonds 114 may be utilized to form electrical connections from the IC chip 104 to a plurality of bonding points 118 which may not be electrically isolated from the DAP 102. Because the contact points 106 are isolated from the DAP 102, the contact points 106 may be utilized to pass signals to and from the PCB (not shown) and the Input/Output (I/O) ports on the IC chip 104. Because the DAP bonding points 118 are not electrically isolated from the DAP 102 or from other DAP bonding points 118, these electrical connections can be used only to ground the IC chip 104.

One limitation of this type of leadless IC package is that the maximum number of terminals that can be utilized to pass electrical signals to and from the I/O ports of the IC chip is limited to the number of terminals that can be located around the perimeter of the DAP. As can be seen in FIG. 2, attempts have been made to increase the number of terminals available for electrical connection with the I/O ports of the IC chip, including decreasing the distance between the terminals in order to fit more terminals around the perimeter of the DAP and increasing the number of rows of terminals disposed around the perimeter of the DAP. However, increasing the number of rows of terminals requires either decreasing the size of the IC chip or increasing the size of the IC package. Additionally, the amount the distance between the terminals can be reduced is limited to the minimum distance between connection points on the PCB, which is relatively large.

SUMMARY

Various embodiments disclosed in this application contemplate leadless integrated circuit (IC) packages having high density contacts and methods of manufacturing. In one embodiment, a leadless integrated circuit (IC) package is shown including a metal leadframe having a top surface and a bottom surface, the metal leadframe comprising a plurality of terminals extending from the top surface to the bottom surface, each of the plurality of terminals comprising a bonding area at the top surface, a contact area at the bottom surface, and a metal trace coupling the bonding area to the contact area. The IC package may also include an IC chip mounted on the top surface of the metal leadframe and comprising a plurality of bonding pads, a plurality of wires, each of the plurality of wires bonded to a bonding area and a bonding pad, an encapsulation compound covering the IC chip, the plurality of wires, and at least a portion of each of the plurality of terminals, wherein the contact areas of the plurality of terminals are not fully encapsulated by the encapsulation compound, wherein at least one of the plurality of terminals comprises a metal trace electrically coupling a bonding area laterally disposed from a contact area such that no line perpendicular to the metal leadframe intersects both the bonding area and the contact area electrically coupled to the bonding area via the metal trace.

In some embodiments, the leadless IC package may include a contact area disposed underneath the IC chip coupled to a bonding area disposed around a perimeter of the IC chip and an adhesive coating interposed between the metal trace and the IC chip. In some embodiments, the bonding area may be laterally disposed from the contact area by one or more of: disposed outwardly from the contact area relative to the IC chip; disposed inwardly from the contact area relative to the IC chip; and disposed parallel to an edge of the IC chip. In some embodiments, a surface area of a bonding area of at least one of the terminals may be smaller than a surface area of a contact area coupled to the bonding area.

In some embodiments, a distance between a center of a bonding area of a first terminal of the plurality of terminals and a center of a bonding area of a second terminal of the plurality of terminals may be less than a distance between a center of a contact area of the first terminal and a center of a contact area of the second terminal. In some embodiments, the IC package may include a first terminal of the plurality of terminals having a first bonding area coupled to a first contact area being disposed substantially directly therebelow, a second terminal of the plurality of terminals having a second bonding coupled to a second contact area disposed substantially directly therebelow, a third terminal of the plurality of terminals having a third bonding area coupled to a third contact area, wherein the third bonding area is interposed between the first bonding area and the second bonding area, and wherein the third contact area is disposed laterally from an area between the first contact area and the second contact area. Another embodiment may include a fourth terminal of the plurality of terminals having a fourth bonding area coupled to a fourth contact area, wherein the fourth bonding area is interposed between the first bonding area and the second bonding area, and wherein the fourth contact area is disposed laterally from the area between the first contact area and the second contact area.

In some embodiments, the leadless IC package may include a first terminal of the plurality of terminals having a first contact area, a second terminal of the plurality of terminals having a second contact area adjacent to the first contact area, and a third terminal of the plurality of terminals having a metal trace routed between the first contact area and the second contact area. Some embodiments may include the bottom surface of the metal leadframe being selectively etched back such that the bottom surface of the metal leadframe is substantially even with a bottom surface of the encapsulation compound and/or wherein the bottom surface of the metal leadframe is selectively etched back such that at least a portion of a bottom surface of the metal trace is substantially even with a bottom surface of the encapsulation compound. While in some embodiments, the bottom surface of the metal leadframe may be selectively etched back such that at least a portion of the metal leadframe inside the encapsulation compound is removed and/or a bottom surface of the metal trace is selectively etched back such that at least a portion of the metal trace inside the encapsulation compound is removed.

In some embodiments, a metal plating applied to a top surface of at least one bonding area of the bonding areas and wherein at least a portion of the metal leadframe below the metal plating is etched away. In some embodiments, substantially all of the metal leadframe below the metal plating is etched away. In some embodiments, a width of a first bonding area of the plurality of bonding areas is less than five mils and a distance between an edge of the first bonding area and an edge of a second bonding area is less than five mils and/or a bottom portion of the at least one metal trace is coated with a protective material, where the protective material may be selected from the group comprising: an epoxy, an oxide, and a solder mask.

In some embodiments, the IC package may include a solderable protection layer formed on a bottom surface of the contact areas, wherein the solderable protection layer is selected from the group comprising: a plating stack-up of nickel (Ni), palladium (Pd), and gold (Au); a plating stack-up of nickel (Ni) and gold (Au); a plating stack-up of nickel (Ni) and silver (Ag); a plating of silver (Ag), gold (Au), or nickel (Ni) and gold (Au); an electrolytic or immersion tin (Sn); a solder coating of tin and lead (Sn/Pb) or a tin-alloy solder; a solder ball of tin and lead (Sn/Pb) or a tin-alloy solder; and a bare copper (Cu) with a coating of an organic solderability preservative (OSP). In some embodiments, the top surface of the metal leadframe comprises a die attach pad; and at least a portion of the IC chip is mounted on the die attach pad. In some embodiments, one or more IC chips mounted to the IC chip and electrically coupled to the metal leadframe.

In some embodiments, a method of manufacturing a leadless integrated circuit (IC) package is shown by first partially etching a top surface of a metal leadframe to form recesses therein, the recesses defining upper portions of a plurality of metal traces, each metal trace of the plurality of metal traces having a bonding area disposed on an upper surface thereof, mounting an IC chip to the metal leadframe, electrically coupling the IC chip to the bonding areas via wire bonds, applying an encapsulation compound to cover the IC chip, the wire bonds, and the plurality of metal traces and to fill the recesses in the metal leadframe, selectively etching a bottom surface of the metal leadframe to isolate each of the plurality of metal traces, each of the plurality of metal traces having a contact area disposed on a lower surface thereof and not fully covered by the encapsulation compound, and wherein at least one metal trace comprises a contact area laterally disposed from a bonding area such that no line perpendicular to the metal leadframe intersects both the contact area and the bonding area.

In some embodiments, the method may include at least a portion of the lower surface of the metal traces being etched back to be substantially flush with a bottom surface of the encapsulation layer. Some embodiments may include applying a protective coating to at least a portion of the lower surface of the metal traces. Some embodiments may include the protective coating comprising one or more of a resistive oxide coating, an epoxy coating, and a protective ink.

In some embodiments, the method may include a portion of the bottom surface of the metal leadframe being etched back to be substantially flush with a bottom surface of the encapsulation layer. In some embodiments, the IC chip may be mounted to a die attach area of the metal leadframe, the die attach area may protrude from a bottom surface of the encapsulation layer a first distance and the contact areas protrude from the bottom surface of the encapsulation layer a second distance, and the first distance is less than the second distance.

In some embodiments, at least a portion of the lower surface of at least one metal trace may be etched back inside the encapsulation compound. In some embodiments, the method may include partially etching a channel into a top surface of the metal leadframe, and flowing a portion of the encapsulation compound between the metal leadframe and the IC chip via the channel to provide the encapsulation compound to isolated and hard to reach portions of the recesses. In some embodiments, the method may include singulating the leadless IC package from a multi-unit leadframe strip.

The above summary of the invention is not intended to represent each embodiment or every aspect of the present invention.

BRIEF DESCRIPTION OF THE DRAWINGS

A more complete understanding of various embodiments of the present invention may be obtained by reference to the following Detailed Description when taken in conjunction with the accompanying Drawings, wherein:

FIGS. 1A-B illustrate an embodiment of a Quad Flat No-lead (QFN) leadless IC package;

FIG. 2 illustrates an embodiment of a Thermal Leadless Array (TLA) IC package;

FIGS. 3A-B illustrate an embodiment of a leadless IC package having a large IC chip relative to the package size;

FIG. 4 illustrates an embodiment of a metal leadframe having a plurality of metal traces formed on a top surface thereof;

FIGS. 5A-E illustrate aspects of an embodiment of a leadless IC package at various stages of a manufacturing process;

FIG. 6A-C illustrate various views of an embodiment of a leadless IC package having two rows of bonding areas and multiple rows of contact areas;

FIG. 7A-B illustrate various embodiments of leadless IC packages having a die attach pad;

FIG. 7C-H illustrate various stages of a manufacturing process for producing various aspects of the leadless IC package of FIG. 7B;

FIGS. 8A-D illustrate various embodiments of leadless IC packages;

FIGS. 9A-C illustrate an exemplary embodiment of a leadless IC package having two IC chips in a flip-chip and wire-bond arrangement;

FIGS. 10A-B illustrate an exemplary embodiment of a leadless IC package having an air cavity therein;

FIGS. 12A-H shows illustrative embodiments of various IC package configurations and a chart of the number of I/O connections for each embodiment shown.

DETAILED DESCRIPTION OF ILLUSTRATIVE EMBODIMENTS

Figure 11B:
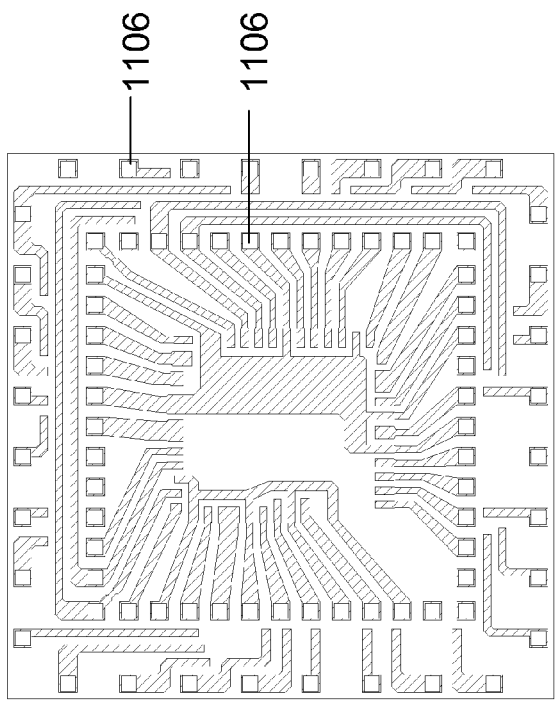
FIGS. 11A-B illustrate an exemplary embodiment of a leadframe of a leadless IC package.

Various embodiments of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

Referring now to FIGS. 3A-B, two views of an embodiment of a leadless IC package 300 are shown. FIG. 3A is a top view of the IC package 300 before encapsulation and FIG. 3B is a side view of a cross section of the IC package 300 of FIG. 3A along line A-A. In the embodiment shown in FIG. 3B, the IC package 300 includes an IC chip 304 disposed in a central portion of the IC package 300 and covered by an encapsulation compound 308 and adapted to be electrically coupled to an external device (not shown), such as a PCB, through a plurality of terminals, each terminal having a bonding area 318, a contact area 306, and a metal trace 322 coupling the bonding area 318 to the contact area 306. In the embodiment shown, the electrical connections are formed using wire bonds 314 to connect the IC chip 304 to the bonding areas 318. The IC package 300 also includes a plurality of metal traces 322 routing electrical connections from the bonding areas 318 to contact areas 306. In this way, the distance between any two bonding areas 318 can be reduced without having to reduce the distance between the corresponding contact areas 306. For example, in FIG. 3A, the distance between centerlines of bonding areas 318A and 318B may be on the order of 0.2 mm, but the distance between centerlines of corresponding contact areas 306A and 306B may be on the order of 0.5 mm. In various embodiments, the number of bonding areas may be increased without reducing the size of the IC chip.

Referring now to FIG. 4, a metal leadframe (LF) 424 is shown having a plurality of metal traces 422 formed on a top surface thereof. In some embodiments, the LF 424 may be a substantially flat metal sheet. Recesses 426 may be etched into the top surface of the LF 424 in a predetermined pattern such that the metal traces 422 are the remaining portions of the metal LF 424 between the recesses 426 (as shown in Detail A). In FIG. 4, the metal traces 422 are shown as shaded portions of the LF 424 and the recesses 426 are shown as non-shaded portions of the LF 424. Although an embodiment is shown having a particular pattern, any number of patterns may be etched into the metal LF 424. Bonding areas 418 for wire bonding to an IC chip may include portions of the metal traces 422 around the periphery of the leadframe 424. As will be described in more detail below, contact areas 406 for electrically coupling an IC chip to corresponding contact points on a PCB may be disposed at an opposite end of the metal traces 422 from the bonding areas 418. In FIG. 4, all of the contact areas 406 (shown as squares) are interiorly disposed relative to the bonding areas 418. However, in various embodiments, some of the contact areas 406 may be disposed directly below the bonding areas 418 or may be disposed outwardly from the bonding areas 418 towards the periphery of the LF 424.

In general, when an IC chip is mounted onto a LF, the portion of the LF below the IC chip is referred to as a die-attach area (DA area). After portions of a top surface of the LF have been selectively etched away, recesses are formed in the LF which define metal traces which have raised surfaces relative to the recesses. When an IC chip is mounted onto an LF having recesses that extend into the DA area, the IC chip will be supported by the metal traces defined by those recesses and voids will exist between the IC chip and the recesses. To secure the IC chip to the metal traces, an adhesive coating may be applied to a bottom surface of the IC chip. In some embodiments, the adhesive coating may be a non-conductive adhesive coating to electrically isolate the bottom surface of the IC chip from the metal traces. After the IC chip has been secured against the metal traces, an encapsulation compound may be applied, for example, by molding, dispensing, spraying, or other encapsulating technique using, for example, epoxy, silicone, or other encapsulating material to cover the IC chip and the metal traces and to fill the recesses in the LF, including filling the voids between the recesses disposed in the DA area and the IC chip.

Referring now to FIGS. 5A-D, aspects of an embodiment of an IC package at various stages of a manufacturing process are shown. In FIG. 5A, the process begins with a metal LF 524. In FIG. 5B, metal traces 522 have been formed by partially etching a top surface of the LF 524 to create recesses 526 defining the metal traces 522. Bonding areas 528 have also been added to a portion of a top surface of the metal traces 522. The bonding areas 528 may be formed by applying a bondable material to the metal traces 522, such as, for example, a plated or clad metal such as silver (Ag), gold (Au), copper (Cu), or other bondable materials. In FIG. 5C, an IC chip 504 has been secured to the LF 524 using an adhesive material 510, for example, an epoxy. In some embodiments, the adhesive material 510 may be applied to an entire bottom surface of the IC chip 504 before the IC chip is mounted to the DA area of the LF 524. In some embodiments, the adhesive material 510 may only be applied to portions of the bottom surface of the IC chip 504 or may be applied to the LF 524. After the IC chip is mounted to the LF 524, the IC chip may be electrically coupled to the bonding areas 528 disposed outside of the DA area. In the embodiment shown, wire bonds 514 have been utilized to provide the electrical coupling.

Referring now to FIG. 5D, an encapsulation compound 508 (shown as shaded areas) has been applied to encapsulate the IC chip 504 and the wire bonds 514. In addition, the encapsulation compound 508 has also filled in the recesses 526, including the recesses 526 disposed in the DA area.

Referring now to FIG. 5E, a bottom surface of the LF 524 has been etched back. In various embodiments, the etching back of the bottom surface may include etching portions of the LF 524 corresponding to the recesses that were formed in a top surface of the LF to thereby completely etch through the LF at those areas thereby exposing a bottom surface of the encapsulation compound 508. In various embodiments, the etching back may include etching portions of some of the metal traces. In some embodiments, portions of the metal traces 522 may be coated with a solderable material 528, such as, for example, a metal plating 528. In some embodiments, a portion of bottom surfaces of the metal traces 522 may be etched back to be substantially even with a bottom surface of the encapsulation layer 508. In some embodiments, a protective coating 529 may be added to a portion of bottom surfaces of the metal traces 522.

Referring now to FIGS. 6A-C, various views of a leadless IC package 600 are shown. FIG. 6A is a top view of the IC package 600. For descriptive purposes, the wire bonds are not shown and only an outline of the encapsulation compound 608 and an outline of a die attach area (DA area) 602 where the IC chip attaches to the LF are shown in this view. In this embodiment, an outer row of terminals having bonding areas 616 disposed directly over corresponding contact areas 606 (shown as dashed lines) and electrically coupled via metal traces 622 and an inner row of terminals having bonding areas 618 laterally remotely disposed from the corresponding contact areas 606 and electrically coupled via metal traces 622. As can be seen, the inner row of bonding areas 618 may be routed to the contact areas 606 below the DA area 602.

Referring now to FIG. 6B, a side view of a cross section of the IC package 600 of FIG. 6A along line A-A is shown. The IC package 600 includes the IC chip 604 having an adhesive layer 610 disposed on an underside thereof for mounting the IC chip 604 to the metal traces 622. In some embodiments, the adhesive layer 610 may be formed of a non-conductive epoxy material. In the embodiment shown, the IC chip 604 has been electrically connected to the outer row of bonding areas 616 using wire bonds 612 and to the inner row of bonding areas 618 using wire bonds 614. In the embodiment shown, metal traces 622 form an electrical path from the inner row of bonding areas 618 to the contact areas 606 below the DA area 602. The encapsulation compound 608 (shown as shaded portions) can be seen encapsulating the IC chip 604 and the wire bonds 612 and 614. In addition, an encapsulation compound 608 can also be seen disposed in the area below the IC chip 604 between the metal traces 622.

Referring now to FIG. 6C, a bottom view of the IC package 600 can be seen. The bottom surface of the IC package 600 includes the encapsulation compound 608 (shown as non-shaded portions), the metal traces 622 (shown as shaded portions), and the contact areas 606 (shown as non-shaded squares). In the embodiment shown, the contact areas 606 around the periphery of the IC package 600 are spaced apart at a predetermined distance. In some embodiments, because there is no routing of these contacts, this distance may be greater than or equal to the minimum distance of separation required by the PCB design specifications. In the embodiment shown, the metal traces 622 provide an electrical connection from the inner row of bonding areas 618 to the contact areas 606 disposed under the DA area, allowing the inner row of bonding areas 618 to be separated by less than the minimum distance required by the PCB design specifications, while still allowing the contact areas 606 to remain at least the minimum distance apart from each other. This allows significantly more electrical connections to be established between an IC chip mounted onto the LF and the PCB onto which the IC package 600 is mounted.

Referring now to FIGS. 7A and B, top views of two embodiments of an IC package 700 are shown. For descriptive purposes, wire bonds are not shown and only an outline of an encapsulation compound 708 and an IC chip 704 has been shown. In this embodiment, recesses 726 have been formed by etching away portions of a top surface of the LF to define bonding areas 716 and 718 and metal traces 722. In addition, the recesses 726 have also been etched away to define a Die Attach Pad (DAP) 702. In various embodiments, the DAP 702 may be a central portion of the top surface of the LF onto which the IC chip 704 may be mounted. In the embodiment shown, the Die Attach Area (DA area) is the portion of the LF to which the IC chip 704 may be mounted and may include both the DAP 702 and portions of the metal traces 722. In various embodiments, it may be beneficial to include the DAP 702 to provide heat dissipation for the IC chip 704, provide structural support for the IC chip 704, and/or provide an electrical ground for the IC chip 704. For example, in the embodiment shown, an additional ground has been provided by electrically coupling metal trace 722a to the DAP 702.

Referring now to FIG. 7B, an embodiment of the IC package 700 having two rows of bonding areas is shown. In this embodiment, the size and shape of the bonding areas in the first row is different than the size and shape of the bonding areas in the second row. For descriptive purposes, wire bonds are not shown and only an outline of the encapsulation compound 708 and the IC chip 704 has been shown. Detail A shows a magnified view of three bonding areas for an outer row of contact areas for the IC package 700. Detail B shows a magnified view of three bonding areas for two rows of contact areas for the IC package 700. As can be seen in Detail A, the bonding areas 716 are disposed directly over the contact areas 706 and therefore the centerlines of the bonding areas 716 must be spaced apart the same distance as the distance between the centerlines of the contact areas 706. As can be seen in Detail B, the bonding areas 716 and 718 may be spaced closer together when one of the contact areas is not disposed directly underneath one of the bonding areas 718. In some embodiments, a channel 703 may be formed in the DAP 702 to facilitate the flow of the encapsulation material into otherwise isolated or hard to reach places Referring now to FIGS. 7C-H, side views are shown of Detail A and Detail B during various processing steps. In FIG. 7C, the recesses 726 have been formed in LF 724 to define the bonding areas 716. Additionally, the top and bottom surfaces of the LF 724 have been selectively plated. In FIG. 7D, the encapsulation compound 708 has been added on top of the LF 724 and the recesses 726 have also been filled with the encapsulation compound 708. In FIG. 7E, a bottom surface of the LF has been selectively etched away to isolate the bonding areas 716 from each other and define the contact areas 706. As can be seen in the embodiment shown, the bonding areas 716 and the contact areas 706 have substantially the same diameters. Even if the diameters of the bonding areas 716 were decreased, the number of the bonding areas 716 that can be disposed in a given area is still limited by the number of the contact areas 706 that can be disposed in the given areas.

Referring now to Detail B of FIG. 7B, there is shown a magnified view of one of the bonding areas 718 of a metal trace interposed between two of the bonding areas 716 having contact areas 706 directly therebelow. In the embodiment shown, the bonding areas 716 and 718 are located on a top surface of the LF and are shown as rectangles and the contact areas 706 are disposed on a bottom surface of the LF and are shown as circles. As can be seen in Detail B, the widths of the bonding areas 716 and 718 in the inner row of bonding areas have been decreased relative to the bonding areas of the outer row (as shown in Detail A). Because the widths of the bonding areas 716 and 718 are smaller than the widths of the contact areas 706, the bonding areas 716 and 718 can be disposed closer together than the contact areas 706. Additionally, in order to decrease the space between the bonding areas 716 and 718, a contact area 706 is not disposed directly beneath bonding area 718.

Referring now to FIGS. 7F-H, various stages of a method for forming the bonding areas 716 and 718 and the contact areas 706 in an embodiment of the IC package 700 are shown. FIG. 7F shows a portion of the LF 724 after a top surface has been partially etched away to form the recesses 726 in the LF 724 defining the bonding areas 716, the bonding areas 718, and the metal traces 722 (one shown in Detail B) extending from the bonding areas 718. In FIG. 7G, the encapsulation compound 708 has been applied covering the bonding areas and filling the recesses. Additionally, metal plating 728 has been selectively applied to a bottom surface of the LF 724 below the bonding areas 716. In FIG. 7H, the bottom surface of the LF 724 has been selectively etched back to remove a portion of the LF 724 disposed below the bonding areas 718 to electrically isolate the bonding areas 718 from the bonding areas 716 and the contact areas 706 disposed below the bonding areas 716.

The partial etching step may be carried out by any number of etching processes, such as, for example, coating a top surfaces of the LF 724 with a layer of photo-imageable etch resist such as a photo-imageable epoxy. The photo resist may be spin-coated onto the LF 724, then exposed to ultraviolet light using a photo-tool, wherein the exposed portions are then removed. The etch resist is thereby patterned to provide the recesses 726 on the top surface of the LF 724. The LF 724 is then etched, by either immersion or pressurized spray, to partially pattern the bonding areas 716 and 718 and the metal traces 722. The etch resist may then be stripped away using conventional means.

Referring now to FIGS. 8A-D, various embodiments are shown as illustrative examples of how bonding areas on a top surface of a LF may be routed using metal traces in conjunction with IC packages having various configurations. Referring now to FIG. 8A, an embodiment of an IC package 800 having two IC chips 804a and 804b stacked one on top of the other can be seen where the IC chip 804b on the bottom is mounted to metal traces extending under the IC chip. Referring now to FIG. 8B, an embodiment of the IC package 800 having the two IC chips 804a and 804b stacked one on top of the other can be seen. As will be described in more detail below, the bottom IC chip 804b is in a flip-chip configuration. Referring now to FIG. 8C, an embodiment of the IC package 800 having two IC chips 804a and 804b mounted side by side in a multi-chip module (MCM) can be seen. While the embodiment shown contains the two IC chips 804a and 804b, a plurality of IC chips may be mounted to the LF. Referring now to FIG. 8D, an embodiment of an IC package 800 having a system-in-package configuration where an IC chip 804 is mounted to the LF and one or more passive components 830, such as resistors or capacitors, are also mounted to the LF. While the embodiment shown contains one IC chip 804 and two passive components 830, a plurality of IC chips and a plurality of passive components may be mounted to the LF within an IC package.

In the past, it was costly to utilize contact points and/or passive components between two IC chips or between an IC chip and other contact points and/or passive components because the points where they connected to a PCB were surrounded by other contact points. In order to provide an isolated electrical pathway to the contact points, a second or third layer of a PCB was necessary which significantly increased production costs. By utilizing metal traces to route from the bonding point to another location, for example, under the DA area, isolated electrical connections can be established without the added expense of utilizing multiple PCB layers.

Referring now to FIGS. 9A-C, an illustrative embodiment of the IC package of FIG. 9B having two IC chips 904a and 904b coupled together in a flip-chip configuration is shown. As can be seen in FIG. 9B, the IC chip 904b on bottom has been attached directly to the electrical contacts using a flip-chip bonding technique, such as, for example, wherein the bond pads of the IC chip 904b contain solder bumps thereon that may be reflowed to bond to upper surfaces of the electrical contacts of the LF. In the embodiment shown, the IC chip 904a on top may be wirebonded to a plurality of bonding areas 916 disposed around a periphery of the IC package 900. Metal traces may be utilized to provide electrical connections between the plurality of bonding areas 916 and the contact points of the flip chip (FC). Referring now to FIG. 9C, a bottom view of the IC package 900 can be seen. The metal traces 922 (shown as shaded in portions) can be seen coupling the bonding areas around the periphery of the IC package 900 to the FC contact points underneath the IC chip 904b on bottom.

Referring now to FIGS. 10A and 10B, FIG. 10A shows an embodiment of a LF 1024 configured to be used to create an air-cavity IC package, and FIG. 10B shows an embodiment of a completed air-cavity IC package 1000 having an IC chip 1004 mounted to the LF 1024. In FIG. 10A, a top surface of the LF 1024 has been partially etched to form recesses 1026 and thereby define metal traces 1022 disposed between the recesses 1026. Metal plating 1028 has also been applied to bonding areas on a top surface of the metal traces 1022 and to the contact areas on a bottom surface of the LF 1024. An encapsulation compound 1008 has also be applied to the LF 1024 such that the recesses have been filled in with the encapsulation compound 1008 and two posts have been formed extending upwardly from the edges of the LF 1024. The completed air-cavity IC package 1000 shown in FIG. 10B was created from the LF 1024 of FIG. 10A by adhering an IC chip 1004 to the LF 1024 and wire bonding the IC chip 1004 to the bonding areas of the LF 1024. Additionally, a lid has been applied across the tops of the posts to seal the IC package creating the air cavity above the IC chip 1004. The lid may be formed of a solid material such as, for example, metal, plastic, glass, ceramic, or other solid material or a combination of one or more of these materials. Additionally, a bottom surface of the LF 1024 has been etched back to isolate the contact areas and the metal traces.

Figure 11A:
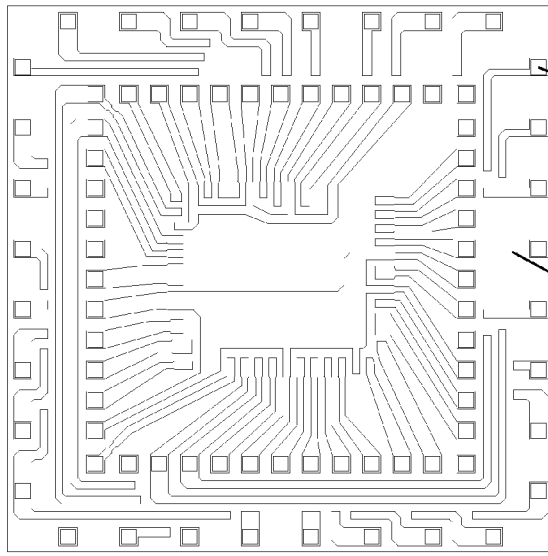

Referring now to FIGS. 11A and 11B, an embodiment of an LF 1124 for use in an IC package is shown. FIG. 11A is a top view of the LF 1124 where recesses 1126 (shown as shaded in areas) have been formed by partially etching away portions of a top surface of the LF 1124 in a predetermined pattern. The un-etched portions of the LF 1124 between the recesses 1126 are the metal traces 1118 that may be used to provide support for an IC circuit mounted thereon and/or provide electrical pathways to route signals between bonding areas on a top surface of the LF 1024 and contact areas on a bottom surface of the LF 1024. FIG. 11B is a bottom view of the LF 1024 where the metal traces (shown as shaded in areas) provide routing from bonding areas on a top surface of the LF 1024 to contact areas 1106 on a bottom surface of the LF 1024. Oftentimes, the location of the contact areas 1106 on the LF 1024 is dictated by the pattern of the contact points on the PCB to which the IC package will be mounted. For example, in the embodiment shown, the contact areas 1106 were required to be uniformly spaced in two rows around the IC package. As can be seen, utilization of a complex pattern of metal traces allowed electrical signals to be routed from the non-uniformly spaced bonding areas to the two rows of uniformly spaced contact areas, a capability that was previously impossible using a metal LF.

In addition to the advances described above with respect to FIGS. 11A-B, the utilization of metal traces to allow contact areas to be remotely disposed from their respective bonding areas has also significantly increased the number of I/O connections available for a given combination of IC packages and chip sizes and has also allowed increased sizes of IC chips to be used in conjunction with a given IC package size. Referring now to FIGS. 12A-H, a chart showing numbers of I/O connections typically available for various IC package configurations along with examples of the various IC package configurations is shown. The chart shown in FIG. 12A shows the typical number of I/O connections available for three different types of 5×5 mm IC packages with a contact-point pitch of 0.5 mm when three different IC chips sizes are mounted therein. The three types of IC packages are: a QFN package (FIGS. 12B and 12C), a TAPP package (FIGS. 12D and 12E), and an HLA package (FIGS. 12F-H). As indicated in the first column of die sizes in the chart, a 4×4 mm IC chip is too large to be used in a 5×5 mm QFN or TAPP type IC package. However, using metal traces to remotely dispose the contact areas from the bonding areas allows a 4×4 mm IC chip to be used in a 5×5 mm HLA type IC package, an example of which is shown in FIG. 12F. As the chart indicates, a typical embodiment may have on the order of 64 I/O connections for contacting two rows of contact points on a PCB. While the chart uses the illustrative embodiment of a 4×4 mm IC chip, even larger IC chips may be mounted on a 5×5 mm HLA IC package type.

The next column shows typical numbers of I/O connections when a 3×3 mm IC chip is used in conjunction with the three different types of 5×5 mm IC packages. When a 3×3 mm IC chip is used with either the QFN or the TAPP IC package type, there is space around the periphery of the IC circuit for only 1 row of contacts, and only 32 and 36 I/O connections, respectively, are available. When the same combination of IC chip and package size is used in conjunction with an HLA IC package type, the number of I/O connections available jumps to 88 with 4 rows of contact areas available for connection to the PCB.

The last column shows typical numbers of I/O connections when a 2×2 mm IC chip is used in conjunction with the three different types of 5×5 mm IC packages. When a 2×2 mm IC chip is used with either the QFN or the TAPP IC package type, up to two rows of contacts areas are available for contacting the PCB with a maximum of 44 and 60 I/O connections, respectively, available. When the same IC chip and package size combination is used in conjunction with the HLA IC package type, the number of I/O connections jumps to 100 with up to 5 rows of contact areas (shown as 1201-1205) available for connecting with the PCB.

The chart shown in FIG. 12A lists a specific number of I/O connections that may be available for a specific combination of IC chip, contact-point pitch, and package size for the HLA package type only for illustrative purposes. These numbers should in no way be construed as a maximum number of contacts possible. For example, depending on design variations, the number of I/O connections that may be available for 5×5 mm HLA IC package having a 2×2 mm IC chip mounted therein may be on the order of more than twice the number shown in FIG. 12H. Various other embodiments may surpass these numbers. In addition, while the chart provides numbers for comparing three 5×5 mm IC package types, the significant increases in I/O connections of the HLA IC package type over the other two IC package types listed would also translate to significant increases in other IC package sizes, whether greater than 5×5 mm or less than 5×5 mm.

Referring now to FIG. 12H in particular, the embodiment shown utilizes metal traces to route from a bonding area to a contact area disposed outwardly from the bonding area. Routing from a bonding area close to an IC chip to a contact area farther away from the IC chip allows a shorter wire bond to be used to connect the IC chip to the bonding area. This may result in significant cost savings by reducing bonding time, especially when expensive metals, such as, for example, gold, are used for wire bonds. As can be seen in FIG. 12H, various embodiments may utilize a combination of routing outwardly and routing inwardly. In some embodiments, routing only outwardly may be used, while in other embodiments routing only inwardly may be used.

Although various embodiments of the method and system of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

What is claimed is:

1. A method of manufacturing a leadless integrated circuit (IC) package, comprising:

providing a metal leadframe having a thickness;

patterning and partially etching a top surface of the metal leadframe to a first depth to form a first pattern of recesses therein, the first pattern of recesses defining upper portions of a plurality of metal traces, each metal trace of the plurality of metal traces having a bonding area disposed on an upper surface thereof, the first pattern of recesses defining a first bonding area, a second bonding area adjacent to the first bonding area, and a third bonding area;

plating with a wire bondable material the bonding areas on the top surface of the metal traces;

mounting an IC chip to the metal leadframe;

electrically coupling the IC chip to the bonding areas via wire bonds;

applying an encapsulation compound to cover the IC chip, the wire bonds, and the plurality of metal traces and to fill the recesses in the metal leadframe to the first depth;

selectively etching a bottom surface of the metal leadframe to a second depth to form a second pattern of recesses therein to isolate each of the plurality of metal traces and to remove at least some of the leadframe disposed below one or more of the bonding areas and to define contact areas on lower surfaces of the plurality of metal traces, the second depth plus the first depth being greater than the thickness of the metal leadframe;

the second pattern of recesses defining a first contact area disposed below the first bonding area and a second contact area disposed below the second bonding area, a width of the first bonding area being less than a width of the first contact area and a width of the second bonding area being less than a width of the second contact area;

wherein a metal trace interposed between the first and second bonding areas electrically couples the third bonding area to a third contact area laterally disposed therefrom, such that no line perpendicular to the metal leadframe intersects both the third contact area and the third bonding area; and applying a protective and conductive layer to the contact areas on the bottom surface of the metal leadframe.

2. The method of claim 1, wherein at least a portion of the lower surface of the metal traces are etched back to be substantially flush with a bottom surface of the encapsulation layer.

3. The method of claim 1 comprising:

applying a protective coating to at least a portion of the lower surface of the metal traces.

4. The method of claim 3, wherein the protective coating comprises one or more of a resistive oxide coating, an epoxy coating, and a protective ink.

5. The method of claim 1, wherein a portion of the bottom surface of the metal leadframe is etched back to be substantially flush with a bottom surface of the encapsulation layer.

6. The method of claim 1 comprising:

wherein the IC chip is mounted to a die attach area of the metal leadframe;

wherein at least a portion of the die attach area protrudes from a bottom surface of the encapsulation layer a first distance and the contact areas protrude from the bottom surface of the encapsulation layer a second distance; and wherein the first distance is less than the second distance.

7. The method of claim 1, wherein at least a portion of the lower surface of at least one metal trace is etched back inside the encapsulation compound.

8. The method of claim 1 comprising:

partially etching a channel into a top surface of the metal leadframe; and flowing a portion of the encapsulation compound between the metal leadframe and the IC chip via the channel to provide the encapsulation compound to isolated and hard to reach portions of the recesses.

9. The method of claim 1 comprising:

singulating the leadless IC package from a multi-unit leadframe strip.

* * * * *